(12) United States Patent
Dey

(10) Patent No.: US 7,696,906 B2
(45) Date of Patent: Apr. 13, 2010

(54) LZW DATA COMPRESSION ALGORITHM

(75) Inventor: Swapan Dey, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 12/191,030

(22) Filed: Aug. 13, 2008

(65) Prior Publication Data

US 2010/0039300 A1 Feb. 18, 2010

(51) Int. Cl.
*H03M 7/34* (2006.01)
(52) U.S. Cl. .................... 341/51; 341/87; 341/106
(58) Field of Classification Search .............. 341/51
See application file for complete search history.

(56) References Cited

U.S. PATENT DOCUMENTS

| | | | |
|---|---|---|---|
| 5,179,378 A | 1/1993 | Ranganathan et al. | |
| 5,818,873 A | 10/1998 | Wall et al. | |
| 5,951,623 A * | 9/1999 | Reynar et al. | 708/203 |
| 6,188,333 B1 * | 2/2001 | Cooper | 341/51 |
| 7,071,854 B1 | 7/2006 | Cardosa et al. | |

OTHER PUBLICATIONS

Jacob Ziv and Abraham Lempel, Compression of Individual Sequences via Variable Rate Coding, IEEE Transactions on Information Theory, Sep. 1978, pp. 530-536, vol. 24, No. 5.
Terry Welch, A Technique For High-Performance Data Compression, IEEE Computer, Jun. 1984, pp. 8-19, vol. 17, No. 6.

\* cited by examiner

*Primary Examiner*—Khai M Nguyen
(74) *Attorney, Agent, or Firm*—Scully, Scott, Murphy & Presser, P.C.; Ronald A. Kaschak

(57) ABSTRACT

An improved LZW algorithm creates images at the time of compression, and obtains codes from those images at the time of decompression. At the time of compression, string (x) is obtained from the input stream and code (x) is retrieved from the LZW table for string (x). Assuming that a valid image (x) exists for the code, the system and method of the present disclosure may either: 1) write code (x) to the output stream, or 2) write image (x) to the output stream. The enhanced decompression algorithm of the present disclosure in one embodiment retrieves the code or image and restores the original stream. In addition, 1 bit is removed from code (x+1), and its information is indirectly stored in code (x)/image (x). Thereafter, when the decompression program encounters image (x) in the compressed stream, the decompression algorithm adds binary bit '1' (or '0') to the code (x+1), and adds binary bit '0' (or '1') to code (x+1) when it encounters code (x).

20 Claims, 3 Drawing Sheets

LZW DATA COMPRESSION ALGORITHM

FIELD OF THE INVENTION

The present disclosure relates generally to data compression and decompression, and more particularly to data compressors, which compress data using an adaptive scheme with a string table, in which the compression depends on the content of the data to be compressed.

BACKGROUND OF THE INVENTION

Data compression is a technique that can be used when either storing or transmitting a block of data, to reduce redundancy or amount of data. By compressing a block of data its effective size can be reduced without reducing the amount of information that is carried by the particular data block. Data compression increases the density of information that is to be stored or communicated by reducing the amount of memory needed to store the block of data or the transmission time necessary to transmit such a block of data. Generally, three characteristics are used to evaluate data compressors: how efficient the compressor is, how fast the compressor is, and whether the compressor can fully reproduce the block of data without introducing any error.

The efficiency of a data compressor is measured in a quantity called a compression ratio, which is calculated by dividing the number of uncompressed characters by the number of compressed characters. The higher the compression ratio the greater the density of the compressed data. A compression ratio of 2 means that the number of characters after compression is half of the number of characters before compression.

There are numerous techniques used to compress data. One method is adaptive compression or as it is sometimes referred to, dictionary based compression. Adaptive compression begins with an empty table of symbol strings and builds the table as the data is compressed so that the contents of the string table will reflect the characteristics of the particular data block. Using this method, a compression ratio above 1 can be achieved if the number of bits required to represent a symbol string is less than the average length of repeated symbol strings. This type of adaptive compression scheme was introduced by Jacob Ziv and Abraham Lempel in an article entitled "Compression of Individual Sequences via Variable Rate Coding", IEEE Transactions on Information Theory, Vol. 24, No. 5, pages 530-536 (September 1978). This method constructs a table or dictionary of symbol strings from the data as it is input to the compressor. Then the next time that a specific string is encountered its corresponding dictionary index will be transmitted instead of the symbol string. This compression scheme is referred to as LZ78 and it requires only one pass over the data in order to perform compression.

In 1984 Terry Welch proposed a variation on the LZ78 procedure in "A Technique For High-Performance Data Compression", IEEE Computer, Vol. 17, No. 6, pages 8-19 (June 1984). This data compression scheme is referred to as the LZW algorithm and also requires only one pass over the data. It is organized around a table, made up of strings of characters, where each string is unique. Each string is referenced by a fixed length code, which represents the longest matching string seen thus far in the previous input plus the one byte that makes this string different from prior strings. Each string is stored in the table at the next available address as determined at the time the string is input.

As the data is input into the compressor, the compressor parses the symbols into strings where as stated above, each string includes the longest matching string seen thus far in the previous input plus the one symbol that makes it different from prior strings. These strings are then added to the table and coded as wK, where w is the index of the previous string, or prefix, and K is the one symbol that makes this string different from prior strings. K is called the extension character of the prefix string w and is represented by its normal binary representation. For every string that is stored in the table its prefix, w, is also stored in the table. The prefix, w, is represented by the binary representation of its address within the table. The number of bits used to represent w will depend on the size of the table to be used.

A Lempel-Ziv-Welch compression algorithm works as follows:

1. Create a table—LZWTable with 2 columns, (string, code).

2. Populate the table with (ASCII characters, ASCII values) using all 256 ASCII characters.

3. instantiate an empty String: string1=" ".

4. While there are more characters to read from the input stream,
   A. char1=get next character from the input stream
   B. if string1+char1 exists in LZWTable then
     i. string1=string1+char1
   A. else
   i. code1=get the code of string1 from LZWTable
   ii. Write code1 to the output stream
   iii. lastCode=Max code in LZWTable
   iv. Add (string1+char1, lastCode+1) to the LZWTable
   V. string1=char1
   A. End if 1. End Loop 2. code1=get the code of string1 from LZWTable 3. Write code1 to the output stream A Lempel-Ziv-Welch decompression algorithm works as follows:

1. Create a table—LZWTable with 2 columns, (string, code).

2. Populate the table with (ASCII characters, ASCII values) using all 256 ASCII characters.

3. string1 Read oldCode from the input stream and find its translation from LZWTable.

4. output string1 to the output stream.

5. char1=string1.

6. While there are more codes to read from the input stream,
   A. Read newCode from the input stream.
   B. If newCode is not present in LZWTable then
   i. string1=get translation for oldCode from LZWTable
   ii. string1=string1+char1
   A. else
   i. string1 get translation for newCode from LZWTable
   A. End if.
   B. Write string1 to the output stream.
   C. char1=1st character of string1.
   D. string1=get translation for oldCode from LZWTable.
   E. lastCode=Max code in LZWTable.
   F. Add (string1+char1, lastCode+1) to the LZWTable.
   G. oldCode=newCode.

1. End Loop.

A review of the described prior art LZW compression and decompression algorithms enables visualization of the input stream as a sequence of strings, for example:

<string (1)><string (2)><string (3)> ... <string (n)> and visualization of an output stream as a sequence of code, for example:

<code (1)><code (2)><code (3)> ... <code (n)>.

Each of the strings are identified and read using a pre-defined method. Then, a code for the string is read from LZW Table and written to the output stream.

Initially the LZW Table is filled up with 256 codes, 0 to 255, where each of the codes are mapped to their respective ASCII characters, and new codes are mapped to new strings in the following manner.

256=>string (1)+(first character of string (2))
257=>string (2)+(first character of string (3))
...
...
255+x=>string (x)+(first character of string (x+1))
...;

where string (x) is the xth string read from the input stream.

Note 1: Since characters are read one by one from the input stream, an entry for a code (255+x) is made in LZW Table only after reading string (x) and the 1st character of string (x+1). Remaining characters of string (x+1) are read after entering code (255+x) in the LZW Table.

The input stream may be visualized as a sequence of codes whose values, e.g., 255+x=>string (x), are read from the LZW Table and then written to the output stream. The output stream may be visualized, therefore, as a sequence of strings:

Input Stream—<code (1)><code (2)><code (3)> ... <code (n)>
Output stream—<string (1)><string (2)><string (3)> ... <string (n)>

Like in the compression method, initially the LZW Table is filled up with 256 codes and then any code 255+x is mapped to string (x)+(1st character of string (x+1)) and entered to the LZW Table where string (x) is the value of code (x) obtained from the LZW Table and code (x) is the xth code read from the input stream.

Note 2: Since codes are read one by one from the input stream, an entry of code 255+x is done only after completely reading code (x) & code (x+1) and then reading LZW Table to obtain string (x) and string (x+1) respectively as the values of the codes. That means unlike the compression method, string (x) & string (x+1) are completely obtained before making an entry for the code 255+x in the LZW Table.

Exception Handling

In the typical LZW algorithms, there may occur a condition in which the string value of a code might not be found in LZW Table at the time of decompression. For example, when at the time of compression, string (x) and 1st character of string (x+1) is read, 255+x=>string (x)+(1st character of string (x+1))

is added to the LZW Table. After reading the complete string (x+1), string (x+1)=string (x)+(1st character of string (x+1)).

Since the code (255+x) was (just) entered in LZW Table for string (x+1), (255+x) is written to the output stream. This means that code (x+1) (255+x). The known decompression algorithm, however, will not find a translation for code (x+1). This is so because even while at the time of compression, (255+x) can be entered into LZW Table before reading string (x+1), it is not possible at the time of decompression according to Notes 1 and 2, explained above.

The prior art LZW data compression/decompression algorithms have developed exception handing routines to accommodate this exception. That is, known prior art methods add the following into LZW Table:

255+x=>string (x)+(1st character of string (x)), and then write the string value of (255+x) in the output stream. Such exception handling accommodates the above exception condition because:

1st character of string (x+1)==1st character of string (x), since string (x+1)==string (x)+(1st character of string (x+1)), as obtained at the time of compression.

BRIEF SUMMARY OF THE INVENTION

A method and system for compressing and decompressing data using Limpel-Ziv-Welch (LZW) algorithm are provided. The compression method in one aspect may comprise, reading data from an input stream and determining whether to output a code associated with the data or an image corresponding to the code associated with the data. The step of determining is based on whether the data combined with the next data in the input stream has a corresponding code and an image of the corresponding code. The method may further comprise removing a binary bit from a code associated with the data combined with next data. Based on the removed binary bit, either the code or the image may be output. For instance, if the removed binary bit is zero, the method may comprise outputting the code associated with the data and if the removed binary bit is one, outputting the image corresponding to the code associated with the data as compression for the data. The method may her comprise outputting the code associated with the data combined with next data having the binary bit removed as compression for the data combined with next data.

A method for decompressing data using Limpel-Ziv-Welch (LZW) algorithm, in one aspect, may comprise reading data from compressed file and determining whether the data read from the compressed file is a code or an image corresponding to the code. Based on whether the data read is a code or an image, the code of the next data read from the compressed file is added a binary bit. For instance, if the data read from the compressed file is an image, the method may comprise adding a binary one to next data in the compressed file. If the data read from the compressed file is a code, the method may comprise adding a binary zero to next data in the compressed file. The method may further comprise using the code or the image corresponding to the code to restore original data corresponding to the data, and using the next data having added binary bit one or zero as a code to restore original data corresponding to the next data.

A program storage device readable by a machine, tangibly embodying a program of instructions executable by the machine to perform above-described methods may be also provided.

Further features as well as the structure and operation of various embodiments are described in detail below with reference to the accompanying drawings. In the drawings, like reference numbers indicate identical or functionally similar elements.

DETAILED DESCRIPTION

Figure 1:
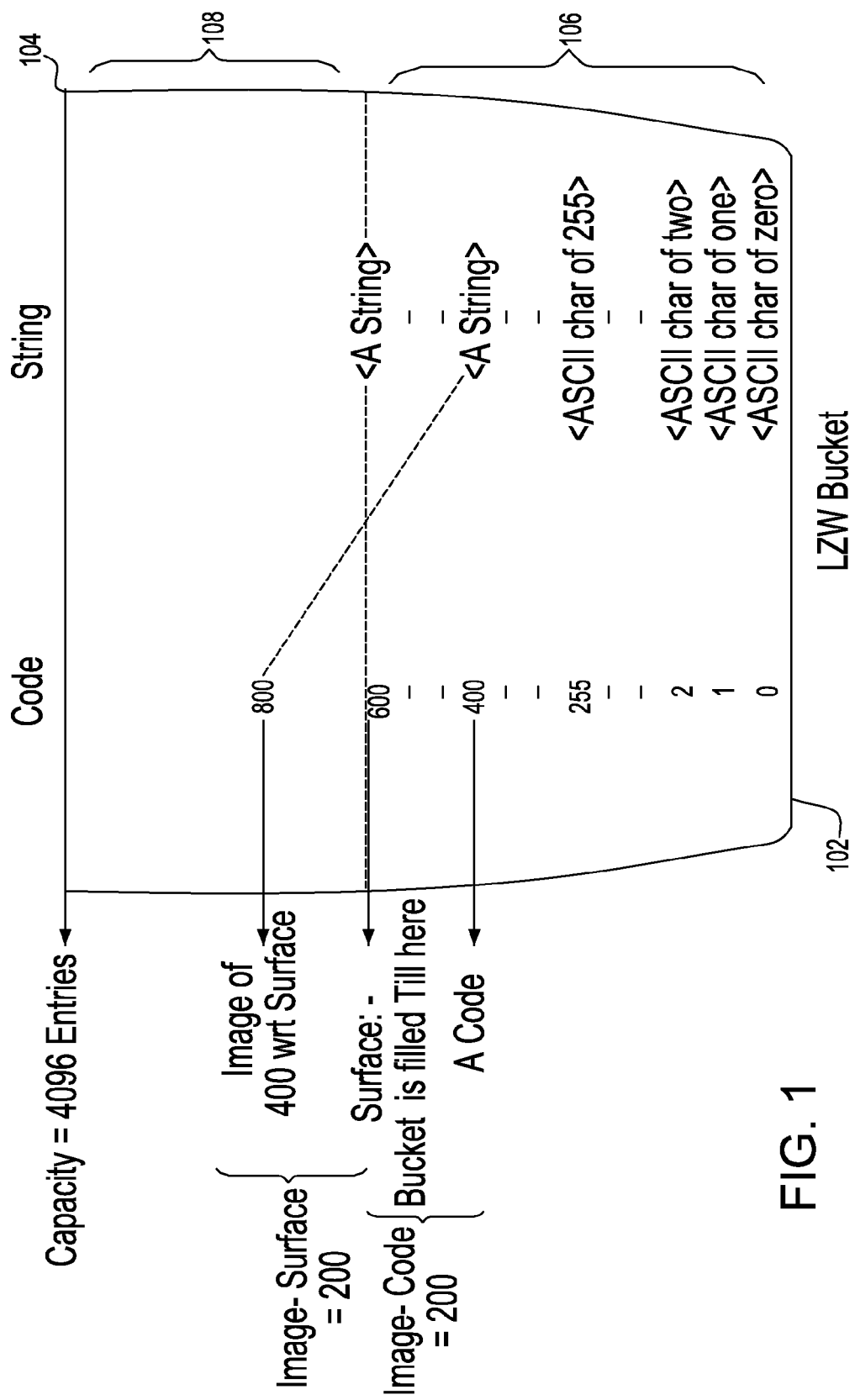
FIG. 1 illustrates an LZW bucket in one embodiment of the present disclosure.

LZW algorithms convert a sequence of strings (<string (1)> ... <string (n)>) to a sequence of codes (<code (1)> ... <code (n)>). The system and method of the present disclosure in one embodiment reduce the size of a plurality of the <code (x)> by 1 bit thus providing more compression in a file. The system and method of the present disclosure in one embodiment can improve operations of many LZW-based variants. For example, a known LZW variant, referred to herein as Variant_1, if modified to operate in accordance with the system and method of the present disclosure in one embodiment may operate as follows:

If Variant_1 converts (<string (1)> ... <string (n)>) to (<code (1)> ... <code (n)>)$_5$ then Variant_1 improved with the system and method of the present disclosure in one embodiment) will convert (<string (1)> ... <string(n)>) to (<smaller code (1)> ... <smaller code (n)>). As a result, many of the <smaller code (x)><code (x)>−1 bit create a smaller compressed file.

The system and method of the present disclosure in various embodiments may be implemented by a computer executing a sequence of program instructions for carrying out the steps of the method, assuming all required data for processing is accessible to the computer. The sequence of program instructions may be embodied in a computer program product comprising media storing the program instructions. As will be readily apparent to those skilled in the art, the system and method of the present disclosure can be realized in hardware, software, or a combination of hardware and software. Any kind of computer system(s) or like—or other apparatus adapted for carrying out the methods described herein—is suited. A typical combination of hardware and software could be a general-purpose computer system with a computer program that, when loaded and executed, carries out the method, and variations on the method as described herein. Alternatively, a specific use computer, containing specialized hardware for carrying out one or more of the functional tasks of the invention, could be utilized.

A computer-based system by which the method of the present disclosure may be carried out may include a processing unit, which houses a processor, memory and other systems components that implement a general purpose processing system, or computer that may execute a computer program product. The computer program product may comprise media, for example a compact storage medium such as a compact disc, which may be read by the processing unit through a disc drive, or by any means known to the skilled artisan for providing the computer program product to the general purpose processing system for execution thereby.

The computer program product comprises all the respective features enabling the implementation of the methods described herein, and which—when loaded in a computer system—is able to carry out these methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product may be stored on hard disk drives within processing unit, as mentioned, or may be located on a remote system such as a server, coupled to processing unit, via a network interface such as an Ethernet interface. A monitor, mouse and keyboard may be coupled to the processing unit, to provide user interaction. Scanner and printer are provided for document input and output. A printer may be coupled to the processing unit via a network connection, but may be coupled directly to the processing unit. A scanner may be coupled to the processing unit directly, but it should be understood that peripherals might be network coupled, or direct coupled without affecting the ability of the processing unit to perform the method of the present disclosure.

In known LZW compression/decompression applications, the capacity of LZW Table is obtained from the size of code (i.e., compression code) used in a particular implementation of the LZW variant (algorithm) utilized. For example, if the size of the code is 12 bits, then 4096 (2**12) different codes are possible. Hence, the LZW Table cannot have more than 4096 entries. It follows that the application program implementing the algorithm and 12-bit Table either must flush the Table when it is filled, or remove some of the Table entries after the Table becomes filled.

The system and method of the present disclosure provide for enhanced LZW compression/decompression by leveraging the unused part of Tables to reduce the size of plurality of the <code (x)> by 1 bit, providing more compression in a file, i.e., a higher compression ratio. By using the part of the table yet to be filled up, the inventive system and method implement an enhanced LZW compression algorithm that renders an improved compressed output. For example, if the size of the code is 12 bits, then capacity of LZW Table is 4096 records. If at some point of time of the compression or decompression process, only 1000 entries are entered into the table, then the remaining 3096 un-entered fields are used to obtain the improved compression (ratio). While known applications operating based on variants of LZW algorithm dynamically increase operation from 9 bits to 12 or 13 bits, and therefore increase the capacity of the Table used based thereon, the system and method of the present disclosure and the enhanced LZW algorithm readily operate to improve compression/decompression operation of such known LZW-variant application programs.

The following terms are referred to herein in the present disclosure.

At the time of compression:
    string (x): The x-th string read from the input stream.
    code (x): The x-th code written to the output stream.
    surface_1 (x): Surface of the bucket updated because of a new entry, which includes:
    column 1: 255+x,
    column 2: string (x)+(next character in the input stream)
At the time of decompression:
    code (x): The x-th code read from the input stream.
    string (x): The x-th string written to the output stream.
    surface_2 (x): Surface of the bucket updated because of a new entry, which includes:
    column 1: 255+x−1,
    column 2: string (x−1)+(1st character of string(x))
From the above definition, [Column 1 of surface_2(x)]=[Column 1 of surface_1(x)]−1.

Imaging by Reflection

The system and method of the present disclosure in one embodiment implement a technique referred to herein as "imaging by reflection." For explanation of "imaging by reflection", LZW Table may be analogized to bucket, within which (code, string) pairs are entered one by one, starting from the bottom. For simplicity, the LZW table is referred to as its LZW bucket. FIG. 1 illustrates an LZW bucket in one embodiment of the present disclosure. Like a water bucket, LZW bucket might be partially filled by (code, string) pairs, where a remaining (unfilled) part of the bucket is empty, allowing for (code, string) pairs to be added to it. The LZW bucket is declared by specifying its capacity: 4096 entries shown at 104. In the example shown, 600 entries are already made as shown at 106, and the rest of the LZW bucket is empty as shown at 108. As in a case of a water bucket, where object inside the water filled bucket portion, the object's image may be projected outside and above the water level when viewed from its projected image. The distance to the object (under water), and the distance of the projected object image from the surface of the water are equal.

Similarly, an image of any (code, string) pairs with respect to the last entry in the bucket (600), the distance of the projected image from the last entry will be equal to the distance of the code with the last entry. That is, surface−code=image−surface, or image=2*surface−code; where:

Surface=the last entry made in the LZW bucket; and
Code=a code whose image is to be found.

As such, for a code=400, and a surface=600, a projected image of the code is equal to 800 because 600−400=800−600=200.

As stated above, the following order of activities occurs at the time of compression:
obtain string (x)
obtain next character
enter code, 255+x into LZW Table
obtain string (x+1)

As also stated above, the following order of activities occurs at the time of decompression:
obtain string (x)
obtain string (x+1)
Enter code 255+x into LZW Table
Imaging by reflection uses the following definition.

surface (x)=[Column 1 of surface_2(x)].

image (x, n): image of a code n with respect to (w.r.t) surface (x).

image (x, n)=2*surface (x)−n.

If surface (x)=600 and n=400, then image (x, n)=2*600−400=800.

Note: If n=surface (x) or n=surface(x)−1 then image (x, n) is invalid because for n=surface (x), image (x, n)=n so the 'image' and 'code' become the same in this case. For n=surface(x)−1, image(x, n)=surface(x)+1. Note, in known LZW algorithms, if surface (x)+1 is found in the input stream at the time of decompression then a special execution path called 'Exception Handling' is invoked. In the system and method of the present disclosure, a code whose value equals surface (x) or surface (x)−1 does not have a corresponding image for that reason.

During compression, the following two options are exercised in the method and system of the present disclosure in one embodiment. If code n is obtained from LZW table for a string string (x) then:

1. Either write the code n to the output stream,
2. Or write image (x,n) to the output stream in case n<surface(x)−1.

Figure 2:
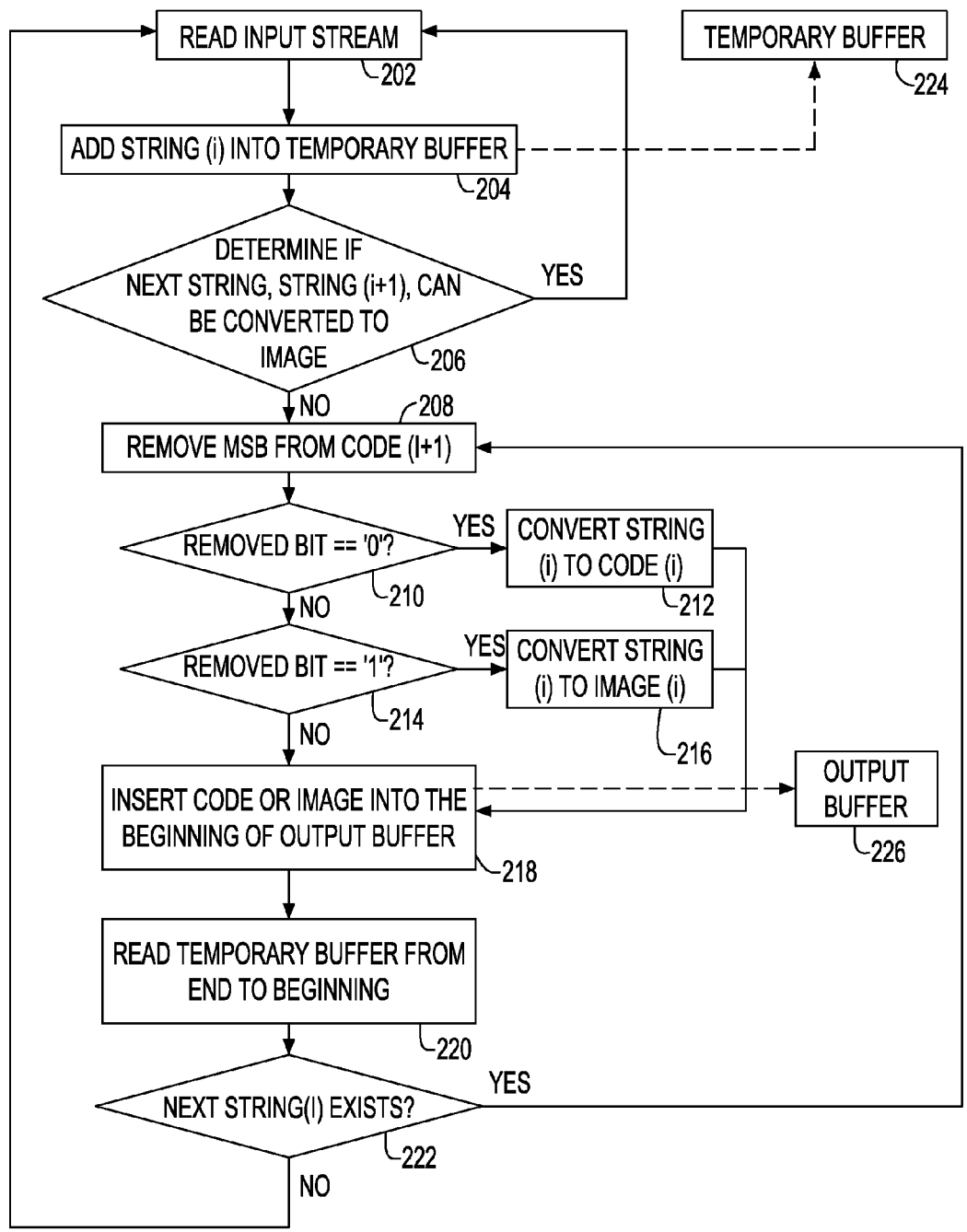
FIG. 2 is a flow diagram illustrating an improved LZW compression algorithm in one embodiment of the present disclosure.

FIG. 2 is a flow diagram illustrating an improved LZW compression algorithm in one embodiment of the present disclosure. This figure illustrates the additional or modified steps implemented by the present disclosure on top of an LZW compression algorithm. In the improved LZW compression algorithm, an LZW table is created as would be done in a typical LZW compression algorithms. At 202, input stream is read and a code for a current string, string (i), in the input stream is created in the LZW table, i.e., if not already present in the table. For purposes of creating the output stream (i.e., compressed stream), a string is either converted to a code or to an image depending on whether the code can be converted to an image. At 204, string (i) is added to a temporary buffer 224. At 206, it is determined whether the code of the next string, i.e., string (i+1) can be converted to an image. A code can be converted to an image if the value of the code is not surface (x) or surface (x)−1 as explained above. If the next string in the input, string (i+1) cannot be converted to an image (i.e., because the code corresponding to that string is either surface (x) or surface (x)−1), the method of the present disclosure in one embodiment proceeds to step 208. At step 208, a bit, for example, the first bit (i.e., the most significant bit (msb)) from the binary value of code (i+1) corresponding to string (i+1) is removed. If at step 210, the removed bit is '0' then string (i) is converted to code (i) at step 212. Otherwise at step 214, if the removed bit is '1' then string (i) is converted to image (i) at step 216. At step 218, the converted code or image for string (i) is stored into an output buffer 226. The remaining part of code (i+1), i.e., minus the removed bit, is also output as the code for string (i+1). At step 220, the temporary buffer 224 is read from end to beginning. At 222, if more string, i.e., next string(i) exists, and if so, the step continues to removing the bit from the code corresponding to that next string at step 208. Otherwise, the step continues to step 202 where more input stream is read.

As an example, as a result of iterations of the steps shown in FIG. 2 until the end of the stream is read, a compressed output may look like:

<code1><image2><code3><image4><image5>
<code6> . . . . A person of ordinary skill in the art would appreciate that either binary '1' or '0' may be used at steps 210 to 216, that is, so long as a decompression algorithm understands those uses. For instance, in this case, finding an image during decompression would indicate that the next code has binary '1' removed, finding a code during decompression would indicate that the next code has binary '0' removed. The decompression algorithm then would appropriately restore the bit that was removed to decompress the data.

Image for a code=n, where n<surface(x)−1 has the following properties:

At the time of compression, if the method of the present disclosure writes image (x,n) in the output stream, instead of writing the code (i.e., 'n') then the original stream can be restored at the time of decompression by the following:

1. Read the code (e.g., 'm') from the input stream

2. If 'm' is not found in LZW bucket and 'm'>surface(x)+1 then the decompression method of the present disclosure in one embodiment can consider m=image (x,n) and 'n' can be determined using the following formula:
n=2*surface (x)−image (x,n).

'n' will be found in LZW bucket since n<surface(x) in this case.

Figure 3:
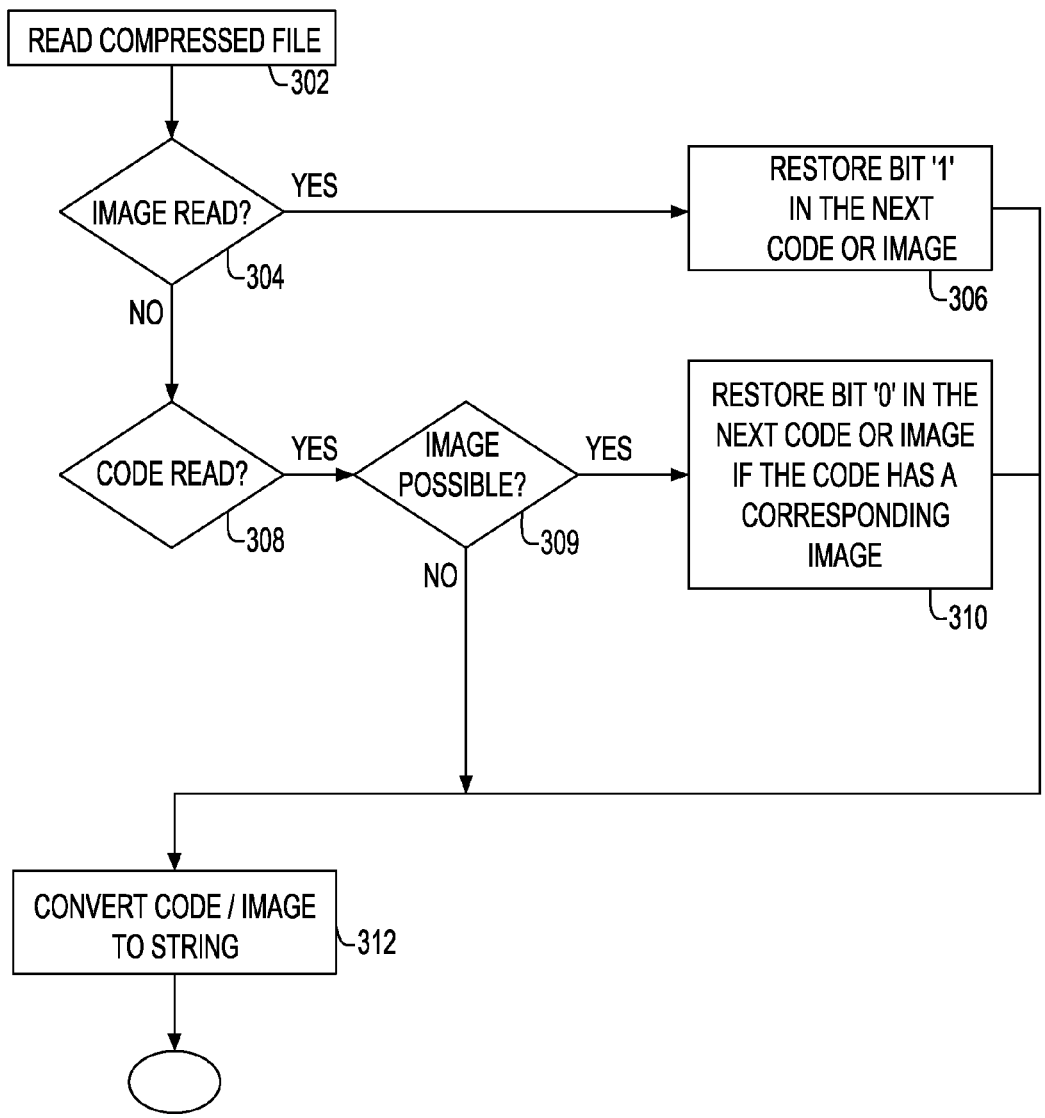
FIG. 3 is a flow diagram illustrating an improved LZW decompression algorithm in one embodiment of the present disclosure.

FIG. 3 is a flow diagram illustrating an improved LZW decompression algorithm in one embodiment of the present disclosure. The decompression algorithm has the capability to distinguish between code and image, and restore the original string. At 302, the compressed file is read. At 304, if the decompression algorithm obtains an image then it assumes that there was a '1' in the beginning of the next code/image, which was removed at the time of compression, and at 306, the '1' is restored in the next code/image by the decompression algorithm. If at 308, if the decompression algorithm obtains a code in the compressed file, then it first checks whether an image was possible for the code at 309. At 310, if an image was possible, then it assumes that there was a '0' in the beginning of the next code or image, which was removed at the time of compression and the decompression algorithm restores '0' to the affected code (next code). The restored code is then used to convert to the original string using the LZW table built in accordance with a typical LZW decompression algorithm at 312.

In the above-described algorithms, LZW bucket refers to an LZW table. A code is entered or exists in the LXW table or bucket. Surface refers to the last code in LZW table or bucket. Images are not actually found in LZW table or bucket. It can be obtained by using the formula, 2*surface−code. So if the decompression algorithm finds a code in the compressed file, whose entry is not found in LZW table or bucket, it assumes that the code is actually an image.

The following illustrates the above-described compression and decompression algorithms of the present disclosure in one embodiment in detail.

Compression:

1. Create LZW Bucket with 2 columns (code, string).

2. Populate it with (ASCII values, ASCII characters) using all 256 ASCII characters.

3. instantiate an empty String: string1=" "

4. Define codeBuffer as a list of codes which is initially empty

5. Define surfaceBuffer as a list of surfaces which is initially empty

6. While there are more characters to read from the input stream
   A. char1=get next character from the input stream
   B. if string1+char1 exists in LZW bucket then
   i. string1=string1+char1
   A. else
   i. string(x)=string1
   ii. code(x)=get the code of string(x) from LZW bucket
   iii. if code(x)<surface(x)−1
     Append code(x) to codeBuffer
     Append surface(x) to surfaceBuffer
   iv. Else
     Define variable msb=Most significant bit of code(x)
       //e.g. '1' if code(x)=101101001100
     code(x)=code(x)−Most significant bit of code(x)
       //1 bit compression
       //e.g. old code(x)=101101001100 new code(x)=01101001100
     Append code(x) to codeBuffer
     Loop on codeBuffer on index y=m−1 . . . 1 if m elements are there in codeBuffer //loop in reverse direction excluding the last entry
       Define output(y)
       If msb='0'
       output(y)=code(y)
       else
       output(y)=image of code(y) w.r.t surface(y) retrieved from surfaceBuffer. that means output(y)=2*surface(y)−code(y).
       msb=Most significant bit of output(y)
       output(y)=output(y)−Most significant bit of output(y)
       //1 bit compression
       replace code(y) in codeBuffer by output(y)
     End loop
     Write all from codeBuffer to output stream
     Make codeBuffer and surfaceBuffer empty
     v. End If
     vi. lastCode=Max code in LZW bucket
     vii. Add (lastCode+1, string1+char1) to the LZW bucket
     viii. string=char1
   A. End if 6. End Loop 7. code1=get the code of string1 from LZW bucket 8. Write code1 to the output stream Decompression:

1. Create a LZW Bucket with 2 Columns, (Code, String).

2. Populate the bucket with (ASCII values, ASCII characters) using all 256 ASCII characters.

3. define msb=null

4. Read input(1) (Can be a code or an image) from the input stream

5. Search input(1) in LZW bucket.

6. If not found then
   image(1)=input(1)
   code(1)=2*surface(1)−image(1)
   msb='1'

7. Else if code(1)<surface(1)−1
   code(1)=input(1)
   msb='0'

8. End If 9. string(1)=Read code(1) from the input stream and find its translation from LZW bucket 10. output string(1) to the output stream 11. char1=string(1)

12. While there are more codes to read from the input stream
   A. Read input(x) from the input stream
   B. If msb is not null then
   input(x)=msb+input(x)
   C. End If
   D. If input(x)>surface(x)+1 then //Image found that means next bit is '1'
     i. image(x)=input(x)
     ii. code(x)=2*surface(x)−image(x)
     iii. msb='1'
     iv. String(x)=get translation for code(x) from LZW bucket
   E. Else If input(x)=surface(x)+1 then //Exception Handling in prior art
     i. String(x) get translation for code(x−1) from LZW bucket
     ii. String(x) string(x)+char1
     iii. msb=null
   F. else if input(x)<surface(x)−1 //A valid image could be created
     i. code(x)=input(x)
     ii. String(x)=get translation for code(x) from LZW bucket
     iii. msb='0'
   G. Else //Valid image could not be created
     i. code(x)=input(x)
     ii. String(x)=get translation for code(x) from LZW bucket
     iii. msb=null
   H. End if
   I. Write string(x) to the output stream
   J. char1=1st character of string(x)
   K. string(x−1)=get translation for code(x−1) from LZW bucket
   L. lastCode=Max code in LZW bucket M. Add (lastCode+1, string(x−1)+char1) to the LZW bucket 13. End Loop The system and method of the present disclosure in one embodiment implement an enhanced LZW algorithm to create images at the time of compression, and obtain codes from those images at the time of decompression. At the time of compression, string (x) is obtained from the input stream and code (x) is retrieved from the LZW table for string (x). Assuming that a valid image (x) exists for the code, the system and method of the present disclosure may either: 1) write code (x) to the output stream, or 2) write image (x) to the output stream. The enhanced decompression algorithm of the present disclosure in one embodiment retrieves the code or image and restores the original stream.

In addition, 1 bit is removed from code (x+1), and its information is indirectly stored in code (x)/image (x). Thereafter, when the decompression program encounters image (x) in the compressed stream, the decompression algorithm adds, for example, '1' to the code (x+1), and adds '0' to code (x+1) when it encounters code (x).

If the decompression algorithm encounters a sequence of code (x), code (x+1) . . . code (x+n), where all of the codes have valid images except code (x+n)₇ the method repeats the above-defined process as follows:

remove 'most significant bit' from code (x+n), and store the information of the removed bit in the form of code (x+n−1)/image (x+n−1);

remove 'most significant bit' from code (x+n−1)/image (x+n−1) and store its information in code (x+n−2)/image (x+n−2); . . . .

remove 'most significant bit' from code (x+1)/image (x+1) and store its information in code (x)/image (x).

The following description further illustrates the enhanced compression and decompression methods of the present disclosure by way of examples.

Consider:

At the time of compression:

string(x)—The xth string obtained from the input stream.

code(x)—The code for string(x) obtained from LZW Table.

image(x)—The image of code(x).

At the time of decompression:

input(x)—code/image directly read from the input stream code(x)—The xth code obtained directly or indirectly from the input stream.

string(x)—The string for code(x) obtained from LZW Table.

image(x)—The image of code(x)

Let at the time of compression string(x) is obtained from the input stream and code(x) is retrieved from the LZW table for string(x). Let a valid image(x) exist for the code. Thus the compression algorithm has two options:

either write code(x) to the output stream or write image(x) to the output stream.

Decompression algorithm can be modified to get the original stream in any of the case. Following is the summary of the modified decompression algorithm:

Loop on each input(x) read from the compressed file
if input(x) is a valid image say, image(x) then
obtain code(x) for image(x) w.r.t 255+x−1 (Section 2.3)
else
code(x)=input(x)
end if
obtain string(x) for code(x) from LZW table
write string(x) to the output file End Loop Further, one bit extra compression may be obtained out of string(x) and string(x+1) than the compression from standard LZW algorithm.

Let's consider code(x) and code(x+1) is obtained from string(x) and string(x+1) and code(x) has a valid image, image(x). One bit compression may be obtained on code(x+1) in the following way:

if 'most significant bit' of code(x+1)=1 then
write image(x) to the output stream
else //(most significant bit=0)
write code(x) to the output file
end if
remove most significant bit from code(x+1)
write the remaining part of code(x+1) to the output stream One bit is removed from code(x+1) and its information is indirectly stored in code(x)/image(x) so that when the decompression program sees image(x) in the compressed stream, it will add '1' with code(x+1) and when it sees code(x) in place, it will add '0' to code(x+1).

If there is a sequence of code(x), code(x+1) . . . code(x+n) where all of the codes can have valid images except code(x+n), the above defined process may be repeated on them in the following way:

remove most significant bit from code(x+n) and store the information of the removed bit in the form of code(x+n−1)/image(x+n−1) as defined in the above example;

remove most significant bit from code(x+n−1)/image(x+n−1) and store its information in code(x+n−2)/image(x+n−2);

. . .

. . .

remove most significant bit from code(x+1)/image(x+1) and store its information in code(x)/image(x).

The above compression method may be generalized in the following way:

Compression

1. Read string(1), string(2), string(3) one by one and obtain code(1), code(2), code(3) respectively for them until we get a code(n) whose valid image cannot be created.

2. That means there is code(1) . . . code(n−1) whose valid images can be created but code(n) does not have any valid image.

3. loop on code(x)=code(n), code(n−1) . . . code(2)
   A. remove most significant bit of code(x)
   B. if the removed bit='1' then
   i. code(x−1)=image(x−1)
   A. else
   i. code(x−1) remains unchanged
   A. end if 4. end loop 5. Loop on code(x) code(1) . . . code(n)
   A. Write code(x) to the output file 6. end loop 7. Repeat step 1 . . . 6 for next set of strings in the input stream Thus for each set of strings read from the input stream, most significant bit is removed from code(2) . . . code(n) and remaining bits are written to the output stream. As result, there is n−1 bit more compression in each set than the compression from standard LZW algorithm.

Decompression

For any input(x) read from the compressed stream the decompression program can find one of the following thing:

1. input(x) is a valid image
2. input(x) is not an image but a valid image could be generated out of it.
3. input(x) is not an image and a valid image cannot be generated out of it.

Option 1 indicates:

1. most significant bit '1' was removed from input(x+1) at the time of compression
2. Thus input(x+1) can be obtained from the compressed stream by reading 1 bit less than the standard size of code.
3. a most significant bit '1' should be added with input(x+1).

Option 2 indicates:

1. most significant bit '0' was removed from input(x+1) at the time of compression
2. Thus input(x+1) can be obtained from the compressed stream by reading 1 bit less than the standard size of code.
3. a most significant bit '0' should be added with input(x+1).

Option 3 indicates:

1. the most significant bit was not removed from input(x+1)
2. Thus input(x+1) can be obtained from the compressed stream by reading bits equal to the standard size of code.

Various aspects of the present disclosure may be embodied as a program, software, or computer instructions embodied in a computer or machine usable or readable medium, which causes the computer or machine to perform the steps of the method when executed on the computer, processor, and/or machine.

The system and method of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

I claim:

1. A computer-implemented method for compressing a stream of data using Limpel-Ziv-Welch (LZW) algorithm, comprising:
   reading data from an input stream;
   determining whether to output a code associated with the data or an image corresponding to the code associated with the data, said determining based on whether the data combined with next data in the input stream has a corresponding code and an image of the corresponding code;
   removing a binary bit from a code associated with the data combined with next data;
   if the removed binary bit is first predetermined bit, outputting the code associated with the data and if the removed binary bit is second predetermined bit, outputting the image corresponding to the code associated with the data as compression for the data; and
   outputting the code associated with the data combined with next data having the binary bit removed as compression for the data combined with next data.

2. The method of claim 1, wherein the first predetermined bit is zero and the second predetermined bit is one.

3. The method of claim 1, wherein the code associated with the data and the code associated with the data combined with next data are stored in an LZW table.

4. The method of claim 1, wherein the image of the corresponding code is determined as 2*last entry in the LZW table—the corresponding code.

5. The method of claim 1, wherein the removed binary bit is most significant bit of the code in a binary format.

6. The method of claim 1, wherein a code does not have an image if the code is equal to last entry in the LZW table or last entry—1 in the LZW table.

7. A computer-implemented method for decompressing a stream of data using Limpel-Ziv-Welch (LZW) algorithm, comprising:
   reading data from compressed file;
   determining whether the data read from the compressed file is a code or an image corresponding to the code;
   if the data read from the compressed file is an image, adding a first predetermined binary bit to next data in the compressed file;
   if the data read from the compressed file is a code, adding a second predetermined binary bit to next data in the compressed file;
   using the code or the image corresponding to the code to restore original data corresponding to the data; and
   using the next data having added binary bit as a code to restore original data corresponding to the next data.

8. The method of claim 7, wherein the binary bit is added as most significant bit of the next data.

9. The method of claim 7, further including entering the code and the next data having added binary bit in a LZW table.

10. A program storage device readable by a machine, tangibly embodying a program of instructions executable by the machine to perform a method of compressing a stream of data using Limpel-Ziv-Welch (LZW) algorithm, comprising:
   reading data from an input stream;
   determining whether to output a code associated with the data or an image corresponding to the code associated with the data, said determining based on whether the data combined with next data in the input stream has a corresponding code and an image of the corresponding code;

removing a binary bit from a code associated with the data combined with next data;

if the removed binary bit is first predetermined bit, outputting the code associated with the data and if the removed binary bit is second predetermined bit, outputting the image corresponding to the code associated with the data as compression for the data; and outputting the code associated with the data combined with next data having the binary bit removed as compression for the data combined with next data.

11. The program storage device of claim 10, wherein the first predetermined bit is zero and the second predetermined bit is one.

12. A program storage device of claim 11, wherein the code associated with the data and the code associated with the data combined with next data are stored in an LZW table.

13. The program storage device of claim 12, wherein the image of the corresponding code is determined as 2*last entry in the LZW table—the corresponding code.

14. The program storage device of claim 13, wherein the removed binary bit is most significant bit of the code in a binary format.

15. The program storage device of claim 14, wherein a code does not have an image if the code is equal to last entry in the LZW table or last entry—1 in the LZW table.

16. The program storage device of claim 15, further including:

reading coded data from a compressed file;

determining whether the coded data read from the compressed file is a code or an image corresponding to the code;

if the coded data read from the compressed file is an image, adding the second predetermined binary bit to next coded data in the compressed file;

if the coded data read from the compressed file is a code, adding the first predetermined binary bit to next coded data in the compressed file;

using the code of the coded data or the image to restore original data corresponding to the coded data; and using the next coded data with added binary bit as a code for the next coded data to restore original data corresponding to the next coded data.

17. The program storage device of claim 16, wherein the first predetermined binary bit is added as most significant bit of the next data.

18. The program storage device of claim 16, wherein the second predetermined binary bit is added as most significant bit of the next data.

19. The program storage device of claim 16, wherein the step of using the code of the coded data or the image further includes finding the code of the coded data in an LZW table to restore original data corresponding to the coded data.

20. The program storage device of claim 14, wherein the step of using the next coded data further includes finding the code for the next coded data in an LZW table to restore original data corresponding to the next coded data.

* * * * *